(12) United States Patent
Hrovat et al.

(10) Patent No.: US 6,977,500 B1
(45) Date of Patent: Dec. 20, 2005

(54) MRI IMAGING WITH A PERL FIELD

(75) Inventors: Mirko I. Hrovat, Brockton, MA (US); Samuel Patz, Chestnut Hill, MA (US)

(73) Assignee: The Brigham and Women's Hospital, Inc., Boston, MA (US)

( * ) Notice: Subject to any disclaimer, the term of this patent is extended or adjusted under 35 U.S.C. 154(b) by 0 days.

(21) Appl. No.: 10/806,985

(22) Filed: Mar. 22, 2004

Related U.S. Application Data (60) Provisional application No. 60/458,048, filed on Mar. 27, 2003.

(51) Int. Cl.[7] ............................................. G01V 3/00
(52) U.S. Cl. ................................................... 324/309
(58) Field of Search ................................. 324/300–322

(56) References Cited

U.S. PATENT DOCUMENTS

| | | |
|---|---|---|
| 5,365,172 A | 11/1994 | Hrovat et al. |
| 5,572,132 A * | 11/1996 | Pulyer et al. ............... 324/318 |

FOREIGN PATENT DOCUMENTS

| | | |
|---|---|---|
| JP | 2002-197985 | * 12/2000 |

OTHER PUBLICATIONS

S. Patz et al. "Initial Experimental result from a PERiodic and Linear (PERL) Spatial Encoding Field", 1 page.
M.I. Hrovat et al. "Image Reconstruction with a PERiodic and Linear (PERL) Spatial Encoding Field", 1 page.
S. Patz et al. "Calibration Techniques for PERiodic and Linear (PERL) Spatial Encoding Field", 1 page.
S. Berger et al. "Spatial Phase Encoding, Resolving Echoes in PERL Imaging", 1 page.
M.I. Hrovat et al. "Effects of Subpixel Integration on PERL Signal Simulations", 1 page.
M.I. Hrovat et al. Anomalous Bo Field from a PERiodic and Linear (PERL) Spatial Encoding Coil, 1 page.
M.I. Hrovat et al. [Title not readable], 1 page.
M.I. Hrovat et al. "Neuman Expansion in Real Variables, An Example of a Bandwidth Limited Expansion", 1 page.
M.I. Hrovat et al. "Signal Reconstruction within a Non-Linear Magnetic Field", 1 page.
F.J. Rybicki et al. "Analytic Reconstruction of Magnetic Resonance Imaging Signal Obtained from a Periodic Encoding Field" Medical Physics, vol. 27 , No. 9, Sep. 2000, 5 pages.
F.J. Rybicki et al. "Reconstruction Algorithm for Novel Ultrafast magnetic Resonance Imaging", vol. 10, 209-215 (1999).
S. Patz et al. "Novel Encoding Technology for Ultrafast MRI in a Limited Spatial Region", vol. 10, 216-224 (1999).

* cited by examiner

*Primary Examiner*—Diego Gutierrez
*Assistant Examiner*—Dixomara Vargas
(74) *Attorney, Agent, or Firm*—Fish & Richardson P.C.

(57) ABSTRACT

A method of reconstructing an image from an MRI machine includes receiving a superposition of phase-weighted spin echoes. This is representative of a two-dimensional spin density that encodes the image. A partial spin density is then recovered from the superposition of spin echoes. This partial spin density is a PERL transform of the two-dimensional spin density. The two-dimensional spin density is then recovered from the partial spin density by analytically evaluating an inverse PERL transform of the partial spin density.

4 Claims, 6 Drawing Sheets

FIG. 13

MRI IMAGING WITH A PERL FIELD

RELATED APPLICATINOS

This application claims the benefit of the Mar. 27, 2003 priority date of U.S. Provisional Application No. 60/458,048, the contents of which are herein incorporated by reference.

FIELD OF INVENTION

This invention relates to MRI (magnetic resonance imaging), and in particular, to MRI in which image data is encoded in a spatially-periodic encoding field.

BACKGROUND

In a conventional MRI system, one often acquires image data in a two-dimensional variable space called k-space. The present state of the art steps through each line of k-space by stepping through a sequence of gradient fields. To acquire the entire 2D data set, one must acquire a set of lines in k-space. Since there is a different sequence of gradient fields for each line of k-space, this can be a time-consuming process.

It is known that by encoding image data in a spatially-periodic encoding field, one can accelerate the image acquisition. Such spatially-periodic fields are sinusoidal, and hence periodic, along one spatial dimension, e.g. x, and vary linearly in the orthogonal spatial dimension, e.g. y. These fields have come to be known as "PERL" fields ("PERiodic in x and Linear in y").

U.S. Pat. No. 5,365,172 to Hrovat, et al., the contents of which are herein incorporated by reference, discloses a method and system for using a PERL field to acquire image data and for processing that data to reconstruct an image. However, although Hrovat teaches methods for reconstructing the encoded image, those methods rely primarily on numerical methods for inverting an integral transform.

SUMMARY

The invention is based, in part, on the recognition of an analytic method for inverting a PERL transform. This method enables rapid image reconstruction of MRI images, as well as the solution of problems arising in many other applications that utilize the PERL transform.

Systems and methods according to the invention avoid encoding data using the conventional k-space in which $k_x$ and $k_y$ correspond to two spatial dimensions. Instead, the systems and methods encode data in a two-dimensional space characterized by $k_x$ and m, where $k_x$ corresponds to one spatial dimension, as it does in traditional MRI, and m represents the index, or order, of a Bessel function.

The PERL signal includes a superposition of spin echoes weighted by Bessel functions of varying order, or index. The process of weighting spin echoes with Bessel functions of different order is referred to herein as "m-weighting." These m-weighted echoes are separated from each other by varying the phase of a spatially periodic field. This spatial phase encoding provides information sufficient to separate out the echoes superimposed on each other. Each individual spin echo is naturally encoded in $k_x$ space. Hence, x spatial information can be obtained in the standard way (by Fourier transform) after the superposed echoes are separated. To resolve y-dependent information however requires a transform along the m-direction. This transform is referred to herein as "the PERL transform."

In one aspect, an image-reconstruction method includes receiving a superposition of phase-weighted spin echoes. The superposition is representative of a two-dimensional spin density that encodes the image. A partial spin density is then recovered from the superposition of spin echoes. This partial spin density is a PERL transform of the two-dimensional spin density. The two-dimensional spin density is then recovered from the partial spin density by analytically evaluating an inverse PERL transform of the partial spin density. Finally, the image is reconstructed on the basis of the two-dimensional spin density.

Particular practices of this invention include those in which recovering the two-dimensional spin density includes evaluating an integral of the partial spin density weighted by a bandwidth-limited eigenfunction orthogonal to the Bessel functions. One example of such a bandwidth-limited eigenfunction includes an integral of a Chebycheff polynomial. A particular example of such an integral is one of the form:

$$M_m(ky) \equiv \frac{(-i)^m}{k\pi} \int_{-k}^{k} \cos\left(m\cos^{-1}\left(\frac{-\omega}{k}\right)\right) e^{-i\omega y} d\omega$$

where $\omega$ is a spatial angular frequency and k is a wave number.

The new methods also include of calibrating a PERL coil by generating a Fourier encoded image using a traditional phase encode gradient field in the direction of the periodic direction of the PERL coil. The PERL field is then substituted for the traditional readout gradient field. The reconstructed image has features indicative of any misalignment between the PERL field and the phase encode gradient field. The feature's locations are then adjusted to reduce the misalignment. This can be achieved by, for example, physically moving the PERL coil or by altering the amplitudes of currents feeding the PERL coil.

Other aspects of the invention include methods of calibrating a PERL coil by generating a Fourier encoded image using a traditional phase encode gradient field that varies along a linear direction of the PERL coil. The PERL field is again substituted for the traditional readout gradient field. The Fourier reconstructed image has features indicative of a mismatch between a magnitude of the PERL field and a magnitude of the gradient field. A current flowing on the PERL coil is then adjusted to reduce the mismatch. In this way, the phase encode field, which is already calibrated, can be compared with the PERL field amplitude and used to calibrate it.

Another aspect of the invention includes an apparatus for generating a PERL field. The apparatus includes a printed-circuit board having first and second layers. A first trace pair has first and second conductive traces that are electrically connected. The first and second conductive traces define respective first and second waveforms on the first layer, with the second waveform being the mirror image of the first waveform. Both the first and second waveforms are spatially periodic in a periodic direction. A second trace pair is electrically connected with the first trace pair. The second trace pair has third and fourth conductive traces, also electrically connected to each other. The third and fourth conductive traces define respective third and fourth waveforms on the second layer. The third and fourth waveforms are identical in shape with the first and second waveforms respectively. However, the third conductive trace extends further than the first conductive trace along a linear direction orthogonal to the periodic direction. Similarly, the fourth conductive trace extends further than the third conducting trace along the linear direction.

In another aspect, the invention includes a substrate having a first surface and a second surface opposed to the first surface. A first conductive trace defines a first waveform on the first surface and a second conductive trace electrically connected to the first conductive trace defines a second waveform on the second surface. Both the first and second waveforms are spatially periodic in a periodic direction. The second waveform is identical to the first waveform but spatially offset therefrom in the periodic direction by a half of a spatial wavelength of the first waveform.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

DETAILED DESCRIPTION

An MRI system in accordance with the invention uses a spatial encoding field of the form:

$$\vec{B}_p(x,y) = \hat{e}_{B_o} G_p y \sin(qx+\theta). \qquad [1]$$

Figure 1:
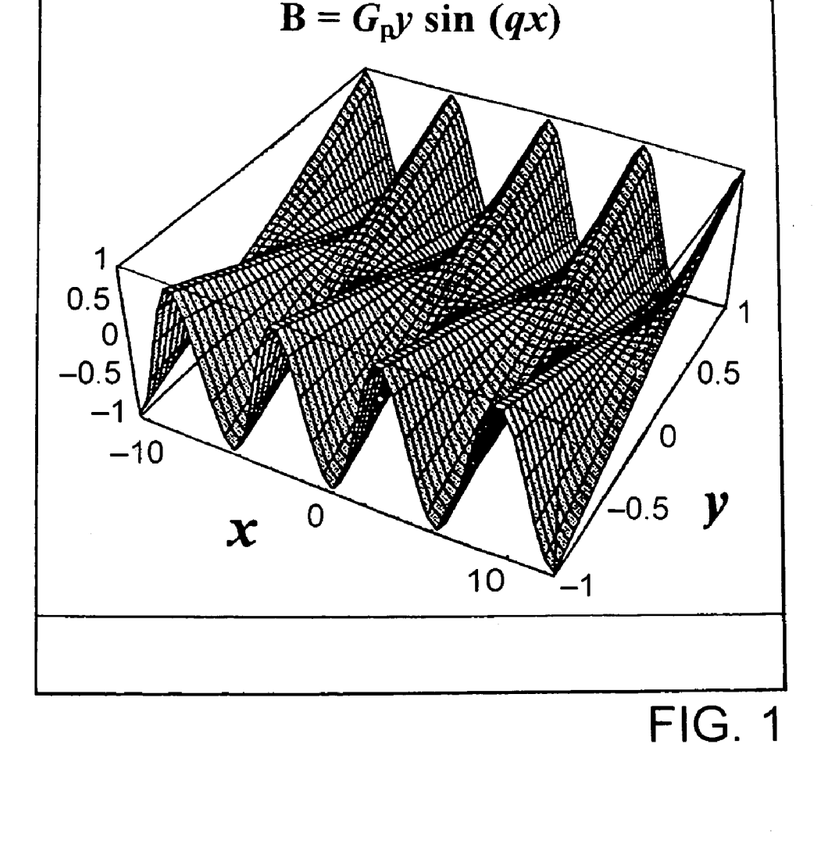
FIG. 1 is a graphical representation that shows a PERL field.

Such a field, which is shown in FIG. 1, is referred to as a "PERL" field because it has a periodic variation in one direction (the x direction in this case) and a linear variation in the other direction (the y direction in this case). These two directions will be referred to as the "periodic direction" and the "linear direction." Although the periodic direction in this example is in the x direction, it is understood that the method described herein does not depend on this being the case.

In equation [1], $G_p$ is the amplitude of the PERL field and $\lambda = 2\pi/q$ is the wavelength of the spatial variation of the field. The direction of the PERL field $B_p$ is parallel to $B_o$, the direction of which is given by the unit vector $\hat{e}_{B_o}$, which may or may not be in the periodic direction without affecting the imaging method disclosed herein.

The periodic component of a PERL field as shown in FIG. 1 can be created by a coil having adjacent currents spaced one-half wavelength apart and directed in opposite directions. Such a coil is shown schematically in FIG. 2.

The PERL imaging sequence uses a spin or gradient echo structure in which the PERL field is applied as a pre-encode field and a traditional $G_x$ linear gradient is used to read out the signal. There is no traditional phase encoding gradient. Since slice-selection is along z, the signal S(t) is given by:

$$S(t) = \iint \rho(x,y) \exp\{-i\gamma[G_x xt - G_p yT \sin(qx+\theta)]\} dx dy, \qquad [2]$$

where T is the time duration of the PERL pre-encode field and the variable t is the readout time. The Jacobi-Anger expansion:

$$e^{iA\cos B} = \sum_{m=-\infty}^{\infty} i^m J_m(A) e^{imB}, \qquad [3]$$

permits an interpretation of equation [2] as the decomposition of a plane wave into a series of cylindrical waves. The significance of this expansion lies in the separation of A and B into separate factors. For PERL imaging, a more useful form of the Jacobi-Anger expansion is given by $$e^{iA\sin(B+\theta)} = \sum_{m=-\infty}^{\infty} (e^{i\theta})^m J_m(A) e^{imB}, \qquad [4]$$

which explicitly represents the contribution of the spatial phase offset, θ, as a simple factor. Using the Jacobi-Anger expansion of equation [4], equation [2] becomes $$S(t) = \qquad [5]$$
$$\sum_m e^{im\theta} \iint \rho(x,y) J_m(\gamma G_p T y) dy \exp\{-i\gamma G_x x(t - mq/\gamma G_x)\} dx.$$

which can be written as a weighted sum of spin echoes $$S(t) = \sum_m e^{im\theta} s_m(t - t_m), \qquad [6]$$

with each spin echo being given by the Fourier transform of a partial spin-density function:

$$s_m(t-t_m) = \int \rho_m(x) \exp\{-i\gamma G_x x(t-t_m)\} dx, \qquad [7a]$$

and the one dimensional spin-density function being given by integrating a two-dimensional spin density function weighted by a Bessel function, an integral that will be referred to as a "PERL transform."

$$\rho_m(x) = \int \rho(x, y) J_m(k_y y) dy, \qquad [7b]$$

where, $$k_y = \gamma G_p T, \text{ and} \qquad [7c]$$

$$k_x = \gamma G_x(t-t_m) \qquad [7d]$$

The received signal can thus be viewed as a sum of spin echoes $s_m(t-t_m)$, each multiplied by a phase factor $e^{im\theta}$. The $m^{th}$ spin echo refocuses at a time $t_m = TE(m) = mq/\gamma G_x$, at which time its phase is zero. Sequential echoes ($\Delta m = 1$) are separated in time by:

$$\Delta TE(\Delta m = 1) = \frac{q}{\gamma G_x} = \frac{2\pi}{\gamma G_x \lambda} \qquad [8]$$

To summarize, equations [7a–d] state that the PERL pulse sequence creates a time-dependent signal consisting of a time series of spontaneously occurring spin echoes. A particular spin echo m refocuses at time $t_m$ and can be calculated by first integrating the spin density with $J_m(k_y y)$ as a weighting function and then Fourier transforming the result with respect to x.

To achieve a desired resolution, the spin echoes must be sampled at times separated by a time interval $\tau$ given by the Nyquist criterion:

$$\tau = \frac{2\pi}{\gamma G_x x_{res}}. \qquad [9]$$

If $\tau$ is greater than the interval between spin echoes, then neighboring echoes will overlap and interfere with each other. Thus the ratio $\tau/\Delta TE$ gives the number of overlapping echoes N:

$$N = \frac{\tau}{\Delta TE(\Delta m = 1)} = \frac{2\pi}{q_x x_{res}} = \frac{\lambda}{x_{res}}, \qquad [10]$$

Note that $1/\Delta TE$ is the frequency bandwidth over one wavelength of the PERL field when the readout gradient is applied, whereas $1/\tau$ is the bandwidth over $X_{res}$. In practice, $\lambda > x_{res}$. Hence, as a practical matter, it is typically necessary to obtain additional information to resolve the overlapping echoes.

Figure 2:
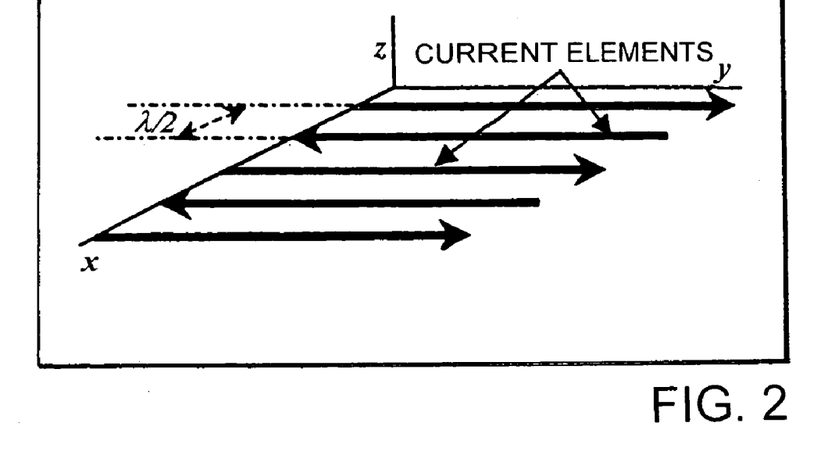
FIG. 2 is a graphical representation that shows an example of an alternating current geometry for creating a periodic field.

The MRI system is operated with overlapping echoes because, as shown in FIG. 2, the periodic component of the PERL coil is produced by parallel current wire segments spaced a half-wavelength apart along the periodic direction with current in adjacent wires being in opposite directions. Although such a coil produces a periodic field in x, Laplace's equation shows that along z, the PERL field $B_p$ decays as $\exp(-z/\lambda)$. Thus, to achieve appreciable penetration of the PERL field into a patient, a value of $\lambda > x_{res}$ is used.

Resolution of N overlapping echoes is achieved by acquiring N independent signals, each with a different value of the spatial phase shift $\theta$, i.e. $\theta_n = 2\pi n/N$, n = 0, ..., N–1. The signal, i.e., equation [6], acquired from each value of the spatial phase encoding (SPE) is denoted by $S^{(n)}(t)$. These signals are then Fourier transformed with respect to $\theta_n$ to obtain N time dependent signals with echoes spaced apart by $N \Delta TE = \tau$:

$$\tilde{S}_m(t) = \frac{1}{N} \sum_{n=0}^{N-1} S^{(n)}(t) e^{im\theta_n} = \sum_k s_{m+Nk}(t - t_m). \qquad [11]$$

An MRI system that uses PERL imaging collects data more efficiently than one that uses conventional Fourier MRI imaging. In a conventional MRI system, the received signal can be represented as $$S(k(t)) = \int\int \rho(x,y) \exp\{i \vec{k}(t) \cdot \vec{r})]\} dxdy, \qquad [12]$$

which clearly shows that if k(t) is a linear function of time, only a portion of k-space is encoded. In a conventional MRI system, additional k-space trajectories are required. These additional trajectories require time-consuming gradient switching or changes in field amplitude. Although faster switching can be achieved by more expensive and sophisticated hardware, the resulting rapid changes in the field can induce undesirable physiological responses in a patient.

In contrast, a PERL MRI system provides a received signal represented by $$S(k_x(t)) = \int\int \rho(x, y) \exp\{i[k_y y \sin(qx+\theta) - k_x(t)x]\} dxdy. \qquad [13]$$

Since $dk_x(t)/dt$ is constant, data acquisition no longer requires gradient switching, as is the case with the conventional MRI system. The only gradient switching in PERL MRI occurs between spatial phase encodes.

The decay of each m-echo in PERL (see equations [7a–d]) depends only on $k_x$ (namely, readout with $G_x$). Since the PERL field is only used for pre-encoding, the periodic dependence of the PERL field along x does not create any "uniqueness" problems. The two-dimensional pre-encode PERL field results in a two dimensional encoding of spatial information. The PERL field is a product of the form $f(x)g(y)$, a form that cannot readily be produced from any combination of linear gradients. As seen in equation [5] the PERL field amplitude modulates the spin density (through $k_y$ in $J_n(k_y y)$) and creates an x-dependent phase shift (m qx) for each m-echo. Applying the readout gradient along x thus resolves the various m-echoes by their respective time shifts.

The PERL signal has an important symmetry property that reduces the number of required spatial encodes. This symmetry property is analogous to the symmetry relationship that exists for Fourier MRI, $S(k_x, -k_y) = S^*(-k_x, k_y)$.

Consider the PERL signal as given by equation [2]. If, in addition to the PERL encode, a readout pre-encoding gradient ($G_{xpre}$) is applied for a duration $T_x$, then $$S(t-t_x) = \int\int \rho(x,y) \exp\{i\gamma[G_x x(t-t_x) - G_p yT \quad \sin(qx+\theta)]\} dxdy. \qquad [14]$$

where $t_x = G_{xpre} T_x/G_x$. Under these conditions the quantity $(t-t_x)$ may be negative. Negative times correspond to the collection of echoes with negative m indices (see equation [6]). Therefore for a particular value of θ, $$S_\theta(-t) = \int\int \rho(x,y)\exp\{i\gamma[G_x x(-t) - G_p yT \sin(qx+\theta)]\}dxdy$$

$$S_\theta^*(-t) = \int\int \rho(x,y)\exp\{i\gamma[G_x x(t) - G_p yT \sin(qx+\theta+\pi)]\}dxdy$$

$$S_\theta^*(-t) = S_{\theta+\pi}(t) \quad [15]$$

The signal collected for positive times with a spatial phase encode of θ+π is the complex conjugate of the signal collected for negative times with a spatial phase encode value of θ. The number of spatial encodes performed in the PERL imaging experiment is equal to the number of overlapping echoes to be resolved. By adding a pre-encode readout gradient, echoes with negative m indices (corresponding to negative time) can be collected. This doubles the acquisition window and halves the number of spatial phase encodes, thereby halving the number of gradient switches.

Information from which an image is reconstructed is contained in the signals acquired with different values of the spatial phase. Hence, to reconstruct the image, one first performs a Fourier transform with respect to spatial phase to separate the superposed echoes. Then, one performs an inverse Fourier transform on each individual echo to obtain the partial spin-density function. One can then use the partial spin-density function to recover the two-dimensional spin-density function from equation [7b] by performing an inverse PERL transform.

An analytic method for inverting the PERL transform shown in equation [7b] requires functions, $M_m(k_y,y)$ (hereafter referred to as the "M-functions") such that:

$$\tilde{\rho}(y) = \sum_m \rho_m(x) M_m(k_y y) \quad [16]$$

where $\tilde{\rho}(y) \cong \rho(y)$ is the reconstructed spin density. The M-functions have the following properties:

$$\int_{-\infty}^{\infty} M_m(y) J_{m'}(y) dy = \delta_{mm'} \quad [17]$$

$$\sum_{m=-\infty}^{\infty} J_m(y) M_m(y') = h(y - y'), \quad [18]$$

where h(y−y') is the system function for the PERL transform and $\delta_{mm'}$ is the standard Kronecker delta function. The function h(y−y') is essentially the point spread function (PSF) for the PERL transform. In terms of the M-functions, the inverse PERL transform is the calculated expression for $\tilde{\rho}(y)$ in terms of $\rho_m$ $$\tilde{\rho}(y) = \sum_{m=-\infty}^{\infty} \rho_m M_m(k_y y) = \rho * h, \quad [19]$$

where ρ*h is the convolution of the functions ρ(y) and h(y).

The inversion of the PERL transform is related to the expansion of a function in terms of Bessel functions of varying index.

$$f(kx) = \sum_n a_n J_n(k_0 x). \quad [20]$$

This expansion, which is referred to as the Neumann series, differs significantly from the more commonly-used Fourier-Bessel series, in which a function is expanded in terms of Bessel functions with varying arguments but constant index.

Suitable M-functions for inverting the PERL transform are given by the integral of a Chebycheff function:

$$M_m(ky) \equiv \frac{(-i)^m}{k\pi} \int_{-k}^{k} \cos\left(m\cos^{-1}\left(\frac{-\omega}{k}\right)\right) e^{-i\omega y} d\omega. \quad [22]$$

The M-functions satisfy two important relations: the closure relation:

$$\frac{\sin(k(x-y))}{k(x-y)} = \frac{\pi}{2} \sum_{n=-\infty}^{\infty} J_n(kx) M_n(ky). \quad [23]$$

and the addition theorem:

$$M_n(k(x+y)) = \sum_{m=-\infty}^{\infty} J_{n-m}(kx) M_m(ky). \quad [24]$$

For reference, note that $M_0(k_y,y)$ is $(2/\pi)*\mathrm{sinc}(k_y y)$ and that the closure relation (equation [23]) is a limiting case of the addition theorem (equation [24]), obtained by setting n=0. The M-functions can be used to invert the PERL transform shown in equation [7b].

The M-functions are also bandwidth-limited eigenfunctions. With this in mind, consider the expansion of a function, ρ(y), which is bandwidth-limited:

$$\rho(y) = \sum_m \rho_m M_m(ky) \quad [25]$$

If ρ(y) is not bandwidth-limited, a convolution with a sinc function, sin(ky)/ky, will make it so. Because the M-functions are orthogonal to the Bessel functions, the coefficients $\rho_m$ can be recovered by evaluating the integral:

$$\rho_m = \int \rho(y) J_m(ky) dy \quad [26]$$

Hence, the image is constructed by simple matrix multiplication, as shown by equation [25], from the coefficients obtained from the PERL imaging experiment. Equation [23] also identifies the sinc function as the point-spread function of the system.

Resolution and Sampling Constraints

By defining the maximum spatial frequency that is observable in the PERL experiment, the parameter $k_y$ in equation [7c] governs the spatial resolution. This is unlike standard Fourier imaging, in which the spatial resolution is determined by the field-of-view in k-space.

Like Bessel functions, the functions $M_n(k_y y)$ are spatially localized. Specifically, $M_n(k_y y) \approx 0$ in the region $|y| < m/k_y$. Thus, one can expand $\rho(y)$ defined in the domain $-L \leq y \leq L$ using only those $M_n(k_y y)$ for which $0 \leq m \leq k_y L$. In one embodiment, the maximum value of m, $M_{max}$, used in the series expansion of equation [16] is the smallest integer $M_{max}$ such that $M_{max} > k_y L$.

Because the Bessel functions and the M-functions are both spatially localized, when an object in a PERL image moves during image acquisition, any motion artifacts generated as a result of that motion corrupt only that portion of the image that includes the moving object. This is different from conventional MRI methods that rely solely on the Fourier transform. In conventional MRI methods, motion of a portion of the image can potentially corrupt the entire image, including those portions that are stationary. A PERL based MRI system is thus eminently suitable for real-time or near real-time viewing of moving images.

Figure 3:
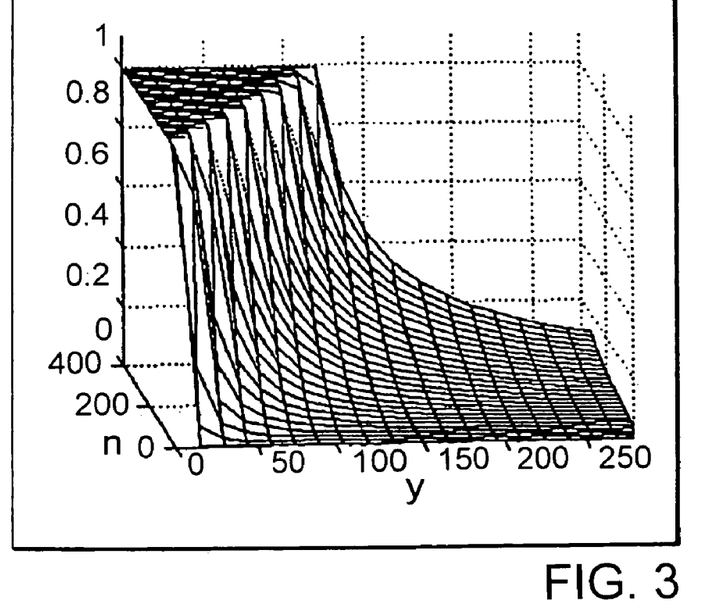
FIG. 3 is a graphical representation that shows the dependence of the sinc function on the number of terms of an expansion.

In another embodiment, $M_{max}$ is determined by examining the dependence of the sinc function, equation [23], on the number of terms in the expansion. This dependence is shown graphically, in FIG. 3, where the function $$h(n, y) = \frac{\pi}{2} \sum_{m=-n}^{n} M_m(\pi y) J_m(\pi y)$$

is plotted against n and y. Note that beyond the plateau at which h=1, the h(n,y) function drops off rapidly.

Figure 4:
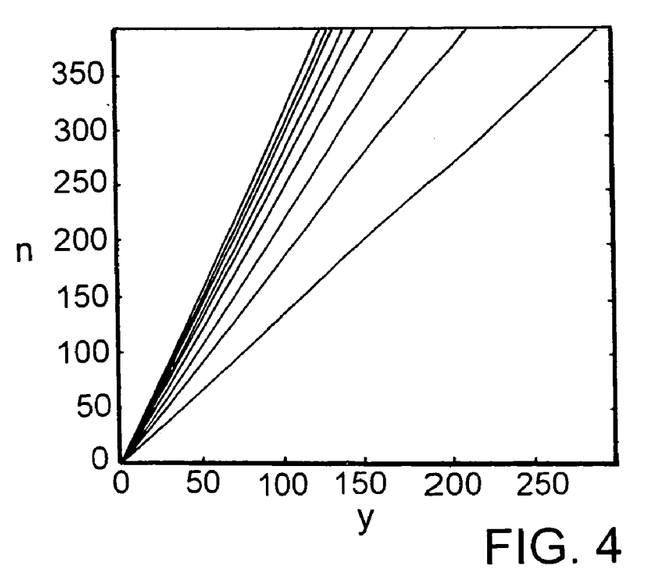
FIG. 4 is a graphical representation that shows contours of the surface shown in FIG. 3.

In FIG. 4, a contour plot shows contours of constant h projected on the ny plane. It is apparent from FIG. 4 that h(n,y) is relatively linear. The slope of the 0.99 contour is very close to $\pi$. For a field-of-view of 2L with N points, $M_{max} \geq \pi N/2$. This suggests a necessary oversampling by $\pi/2$ along the linear direction.

PERL Field Geometry

A variety of PERL fields can be used to encode image information. In one embodiment, a PERL field of the form:

$$B_z(x, y, z) = G_y y \sin(qx) \begin{Bmatrix} c_1 e^{qz} + c_2 e^{-qz} \\ c_1 \cosh(qz) + c_2 \sinh(qz) \end{Bmatrix} \quad [27]$$

is used. Such a PERL field is created by a single-sided coil (for the exponential decay in the slice direction, z) or by a double-sided coil (for the hyperbolic sine and cosine decay in the slice direction). An advantage of the foregoing PERL field is that the field-of-view in the linear direction (y) is not restricted by the periodicity in the periodic direction (x). As a result, it is possible to design coils having a large field-of-view along both the linear and periodic directions.

For the foregoing PERL field geometry, multislice imaging is achieved by adjusting the amplitude of the PERL field, $G_p$, for each slice to maintain a constant $k_y$.

Oblique slice imaging is achieved by imaging the projection of the desired oblique slice onto the xy plane. Variation of the amplitude of the PERL field across an oblique slice is taken into account by letting the wave number in the linear direction be a function of the slice coordinate. For example, suppose a z-slice is tilted along y (rotation about x) in a field whose variation in the slice direction (z) is given by cosh (qz). Then, the wave number in the linear direction (see equation [7c]) is given by ($k_y(z) = \gamma G_p T \cosh(qz)$) and the reconstruction along the linear direction y yields an equation of the following form:

$$\tilde{\rho}(y') = \sum_m \int \rho(y) J_m(k_y(z) y) d y \, M_m(k_{ym} y') \quad [30]$$

$$\tilde{\rho}(y') = \int \rho(y) \sum_m M_m(k_{ym} y') J_m(k_y(z) y) d y$$

where $k_{ym}$ is the minimum value of $k_y$ in the slice's field-of-view.

Application of the addition theorem (equation [24]) gives:

$$\tilde{\rho}(y') = \int \rho(y) M_0 \left( k_{ym} \left( y' - \frac{k_y(z)}{k_{ym}} y \right) \right) d y \quad [31]$$

For oblique slices it is preferable to generate the PERL field with a single side coil to insure monotonicity. A single sided coil also provides greater convenience in placement of the coil as a surface gradient coil.

In another embodiment, a double-sided planar coil can be used to generate a PERL field of the form:

$$B_z(x,y,z) = G \sinh(qy) \sin(qx) \quad [28]$$

Alternatively, a cylindrical coil can be used to generate a PERL field of the form:

$$B_z(x, \rho, \phi) = G I_1(q\rho) \sin(qx) \begin{Bmatrix} \cos\phi \\ \sin\phi \end{Bmatrix} \quad [29]$$

where $I_1$ is a modified Bessel function.

Both of the foregoing PERL field geometries share the advantage of depending only on two directions, and not on a third direction. Such PERL field geometries are thus desirable for three-dimensional, or whole body applications.

Figure 5:
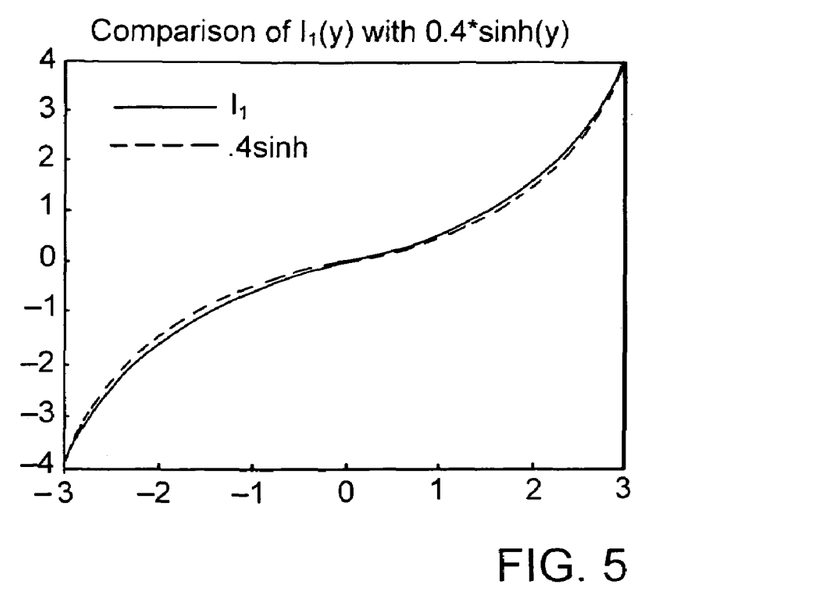
FIG. 5 is a plot comparing the modified Bessel function with the hyperbolic sine function.

One disadvantage of the foregoing PERL field is apparent from FIG. 5, which compares the modified Bessel function with the hyperbolic sine function. As shown in the figure, the linear region of both of these functions extends to a maximum qy of approximately 1. This results in a field-of-view of approximately $\lambda/\pi$. To expand the field-of-view, it is therefore desirable to use PERL coil designs that create fields with longer spatial wavelengths. Alternatively, the field-of-view can be extended by correcting the image for gradient nonlinearities using techniques known in conventional MRI.

The choice of positional variables in all the foregoing PERL fields is arbitrary. The various variables can be permuted without consequence. For example, as shown, the periodic direction is the x direction. However, the periodic direction can also be the y direction or the z direction.

In one embodiment, a three-dimensional image is obtained by phase encoding the slice direction and performing a two-dimensional PERL experiment at each such phase encode. The resulting phase-encoded two-dimensional images are then Fourier transformed along the slice direction to produce a three-dimensional image. The total number of data acquisitions for this experiment will be $N_{pe} * N_{spe}$, where $N_{pe}$ is the number of phase encodes along the slice direction and $N_{spe}$ is the number of spatial phase encodes.

In another embodiment, a three-dimensional image is obtained by rotating the periodic direction of the PERL field 45°. A phase encoding gradient is then applied along the slice direction. For example, with the periodic direction rotated to be parallel to the line x+y, and with z being the slice direction, the signal for the $n^{th}$ phase encode (with gradient $G_z$ of duration $T_z$) is given by $$S_n(t) = \sum_m e^{i\,m\theta} \int\int\int \rho(x, y, z) J_m(\gamma G_y T y) d\,y \exp\left\{-i\gamma G_x x\left(t - mq\bigg/\sqrt{2}\,\gamma G_x\right) - i\gamma G_z T_z z\left(n - mq\bigg/\sqrt{2}\,\gamma G_z T_z\right)\right\} dx\,dz \quad [32]$$

As indicated by the above equation, rotating the periodic direction increases the spatial wavelength of the PERL field by a factor of $\sqrt{2}$, thereby increasing the field-of-view. Alternatively the wavelength can be also be decreased by a factor $\sqrt{2}$, thereby reducing the field-of-view.

It is also apparent from the above equation that the m-echo maximums will occur on the diagonal of the two dimensional n–t space. This increases the distance between m-echoes and thereby reduces the number of spatial phase encodes needed to achieve a particular resolution.

Figure 6:
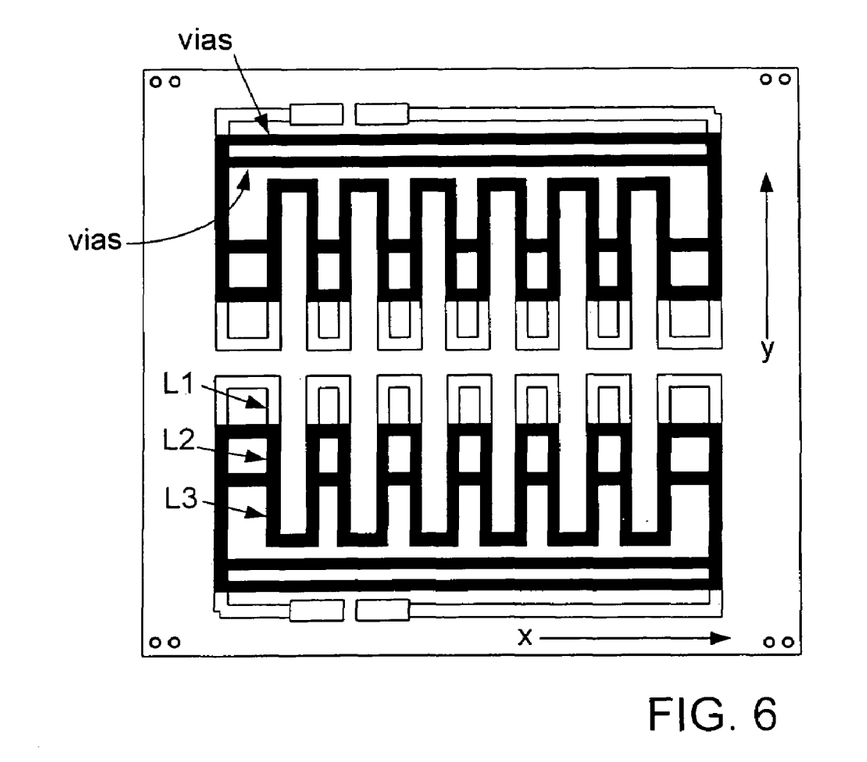
FIG. 6 is schematic diagram of a PERL coil.

FIG. 6 shows a PERL coil formed on a printed circuit board. The printed circuit board has a periodic direction and a linear direction, designated as x and y respectively in FIG. 6. Each printed-circuit board is a three-layer structure having a total thickness of approximately 1.95 mm.

Each layer of the printed-circuit board has imprinted thereon first and second spatially periodic conductive paths. The conductive paths are 8 millimeters wide and made of 0.21 millimeter thick copper. The spatial period of each conductive path is one-half of the desired spatial wavelength. In the illustrated example, the desired spatial wavelength is 5 centimeters. Hence the spatial period is 2.5 centimeters.

In practice, edge effects arise in the PERL field because the conductive paths extend only a finite distance in the periodic direction. To correct for these edge effects, the spatial period can be made to vary. The spatial period may either by lengthened or shortened to reduce these edge effects.

The first and second conductive paths on each layer are mirror images of each other and are electrically connected such that the same current flows through both paths. Preferably, the first and second conductive paths are in series with each other. This mirror image geometry allows the linear component of the field to pass through zero in the "y" center of the coil. As a result, the PERL field changes sign as one traverses the coil in the linear direction. The three pairs of first and second conductive paths, one pair on each layer, are electrically connected by vias shown in FIG. 6.

Although the conductive traces on each layer have the same spatial period, they differ in the extent to which they vary in the linear direction. It is this variation in the linear direction that causes a linear variation in the field generated by the coil. In the illustrated embodiment, these extents differ by multiples of 3.33 centimeters. As a result, the current density is highest at the edges of the printed-circuit board and decreases towards the center of the printed-circuit board. Because of its dependence on current density, the magnetic field increases in amplitude from a minimum at the center of the coil to a maximum at the edge of the coil.

In the embodiment shown in FIG. 6, there are three layers. However, a variation of the field in the linear direction can also be affected by only two layers or by more than three layers. In many cases, it is desirable to have a large number of layers, with trace pairs on different layers defining paths that are only slightly different from each other. Such a configuration generates a magnetic field that more closely approximates a linear field in the linear direction.

The spatial phase of a PERL field generated by a single coil as shown in FIG. 6 cannot readily be varied. To enable variation in the spatial phase, it is useful to position two printed-circuit boards, each configured as shown in FIG. 6, adjacent to each other and to offset them in the periodic direction. By appropriately varying the amplitudes of the currents in the two printed-circuit boards, it is possible to generate a PERL field having an arbitrary spatial phase.

In one embodiment, the offset in the periodic direction is selected to be ¼ of the desired spatial wavelength. This results in PERL coils that generate PERL fields in spatial phase quadrature.

Figure 7:
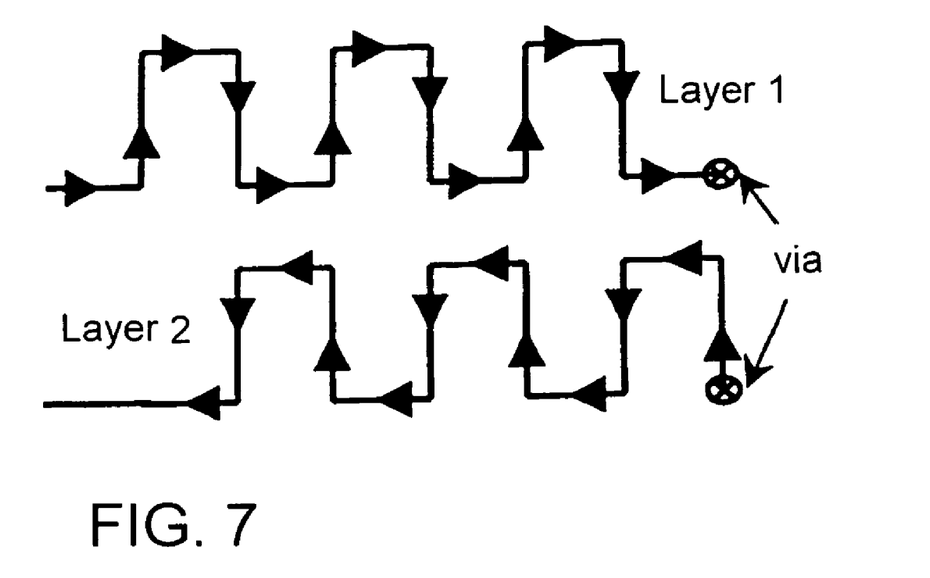
FIG. 7 is a diagram of two conductive traces.

Another embodiment of a PERL coil is built by superposing trace pairs in which each trace has two constituent conductive paths, as shown in FIG. 7. Each path is imprinted on a layer of a printed circuit board.

A path is made up of transverse segments and connecting segments that connect adjacent transverse segments. Current on the transverse segments generates a magnetic field in the desired direction. The connecting segments are necessary only to establish current continuity between adjacent transverse segments. Current on the connecting segments generates a magnetic field that is generally orthogonal to the desired direction. However, this current also may also generate a transverse component, i.e., a component parallel to $B_o$, that tends to distort the field generated by the transverse segments.

Figure 8:
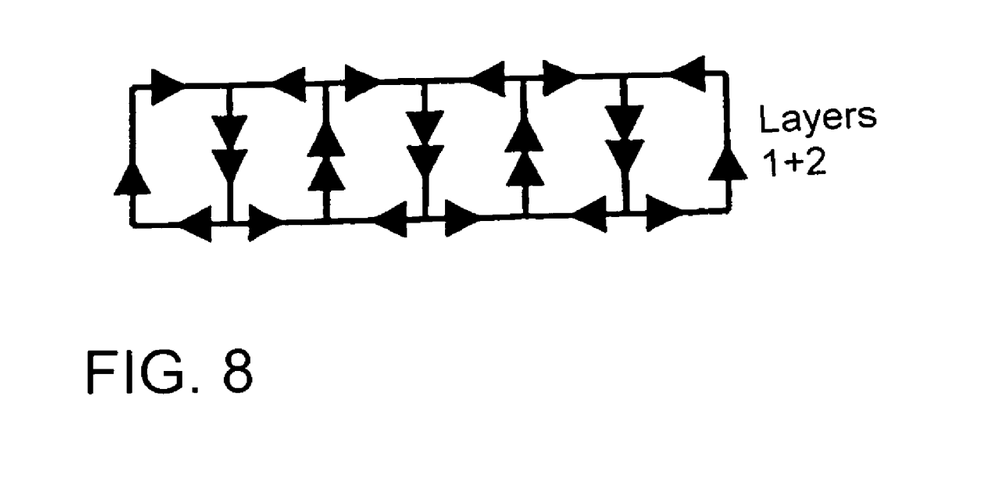
FIG. 8 is a diagram showing the superposition of the traces shown in FIG. 7.

To reduce the distorting effect of current on the connecting segments, the two paths are superimposed on each other, forming a trace, as shown in FIG. 8, so that the currents on the connecting segments generate magnetic fields tending to cancel each other.

The two paths are connected at vias between the two layers. The alternating current elements that produce the periodic component of the field, i.e., the current on the transverse segments, are the same in each layer. However, the currents on the connecting wire segments joining the transverse are in opposite directions in the two layers. As a result, the net magnetic field component arising from current on these connecting wire segments is zero.

The distribution of conducting traces shown in FIG. 7 thus creates a magnetic field that is periodic in the periodic direction without introducing anomalous magnetic fields arising from current on the connecting wire segments.

A trace pair made up of traces as shown in FIG. 8 does not, by itself, generate the linearly varying component of a PERL field. The linear portion of the PERL field is created by including several additional layers of trace pairs made of traces as shown in FIG. 8, with each trace having transverse segments of different extent in the linear direction. These additional layers are included for each of the two initial layers with oppositely directed connecting wire segments. Thus the method for creating the linear portion of the field is identical to that described in connection with FIG. 6.

To achieve a PERL field with arbitrary spatial phase, two coils (referred to as the sine and cosine coils) separated by a quarter wavelength can be deployed, as discussed in connection with the embodiment of FIG. 6. In some embodiments the sine and cosine coils are on different printed circuit boards. However, in other embodiments, the sine and cosine coils are on different layers of the same printed circuit board.

Figure 9:
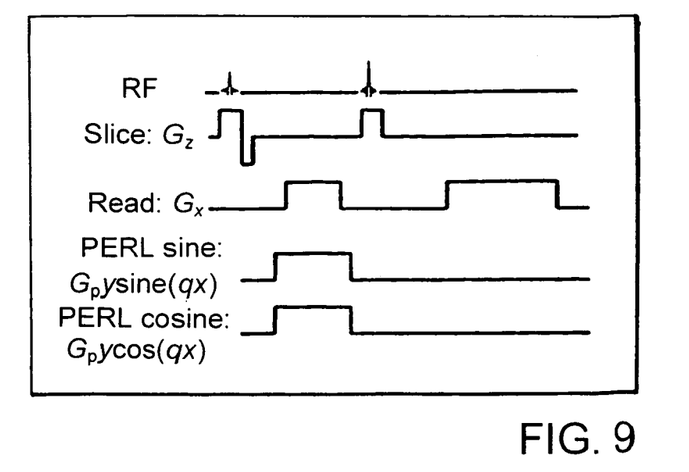
FIG. 9 is a diagram of the pulse sequence for PERL imaging.

The basic PERL imaging pulse sequence is shown schematically in FIG. 9. Notice the existence of a traditional readout pre-encode gradient pulse that forces the m=0 PERL echo to occur at the spin echo time, i.e. at the center of the readout gradient. In effect, PERL imaging uses two standard linear gradients: one for slice selection and one for readout. The conventional phase encode gradient, however, is replaced by the PERL field.

Calibration of the PERL coil includes matching the characteristics of the field produced by the PERL coil with the gradient field produced by a conventional MRI system. This includes physically positioning the PERL coil so that a central zero crossing of its periodic field corresponds to the x=0 position of the MRI's $G_x$ gradient. It also includes selecting a current to pass through the PERL coil so that the amplitude of the PERL field thus generated is consistent with the amplitude of the gradient field generated by the MRI system.

Figure 10:
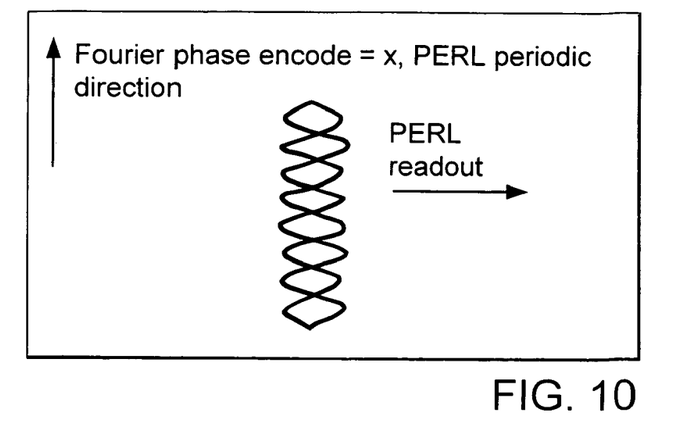
FIGS. 10 and 11 are images used during calibration of the MRI system.

To align the position of the PERL field with the gradient field, a standard Fourier encoded image is acquired with the conventional phase encode gradient varying along the periodic direction, x. However, the readout gradient is not used for recovering the encoded image. Instead, the PERL field, which varies linearly in the y direction and sinusoidally in the x direction, is used. This results in the formation of an image as shown in FIG. 10. The nodes of the waveform in FIG. 10 show the x coordinates of zero crossings of the periodic field. To properly position the PERL coil, the x coordinates of the nodes in FIG. 10 are measured using the position tool on the scanner, and the PERL coil repositioned to locate align a node at x=0.

As an alternative to using the position tool and physically moving the PERL coil, it is also possible to adjust the x coordinates of the nodes by adjusting the ratio of currents in the sine and cosine coils to produce a phase offset.

Another alternative to using the position tool is to obtain two field maps, one of the linear x-gradient and the other of the PERL field. From the field maps, the zeros of the periodic field and the actual zero of the gradient field will be apparent. Again an appropriate electronic adjustment to the phase θ can be made to zero the offset.

The foregoing calibration procedure is limited in accuracy to the resolution of a display. In some cases, it may be desirable to perform a second calibration step whose accuracy is not limited to a display resolution. One such calibration step relies on the ability to separate all the spin echoes of a PERL experiment by performing a Fourier transform of the spatial phase encoded signals. As noted above, the center of each spin echo has the form $s_m(0)e^{im\theta}$, where $s_m(0)$ is a real number, $e^{im\theta}$ is a phase factor arising from the spatial phase offset, and m is the echo number. The first step is to calculate the phase $\theta_m$ at the center of each echo. The $\theta_m$ are expected to approximate $m\theta$ (for $s_m(0)$ positive) or $m\theta+180°$ (for $s_m(0)$ negative), mapped back into the interval (−180°, 180°). Since θ is small (from the initial calibration), the function $m\theta$ varies slowly with m. This enables the $\theta_m$ to be fit to the line $m\theta$ by linear regression. In so doing, it may be necessary to add 180° and a multiple of 360° to each $\theta_m$ because the corrected phases $\theta'_m$ do not stay in the interval (−180°, 180°), but in fact wind around an arbitrary number of times.)

The error, $\Delta\theta_m$, in the measured value $\theta_m$ arises in part from noise in the receiver coil and from residual overlap between spin echoes. These errors are more severe for echoes whose amplitudes are small. Since many more $\theta_m$ are available than are needed for accurately determining θ, one approach to reducing error is to ignore the $\theta_m$ that correspond to echoes whose amplitude is less than a selected threshold. The remaining $\theta_m$, i.e. those with amplitudes above the threshold, can be used to determine θ.

The calculated value θ differs from the actual value by a small error δθ. If the offset is corrected using the calculated value, the corrected signal $$S(t) = \sum_m s_m(t - t_m) e^{im\delta\theta}$$

will have a residual factor of $e^{im\delta\theta}$. To determine the effect of this residual factor on the corrected signal S(t), it is first necessary to estimate δθ. The linear regression gives an error $$\delta\theta \sim 2\sqrt{6}\Delta\theta/(\Delta m)^{3/2}$$

(assuming a selected threshold equal to the median amplitude, in which case half the echoes are used). Thus, mδθ varies by an amount $$\Delta m\delta\theta \sim 2\sqrt{6}\Delta\theta/(\Delta m)^{1/2}$$

over the full range Δm of echoes. If there are $\Delta m = m_{max} - m_{min} = 300 - (-300) = 600$ echoes, then for phase measurement errors even as large as $\Delta\theta \sim 10°$, $\Delta m\delta\theta \sim 0.2\Delta\theta$, or 2°.

Figure 11:
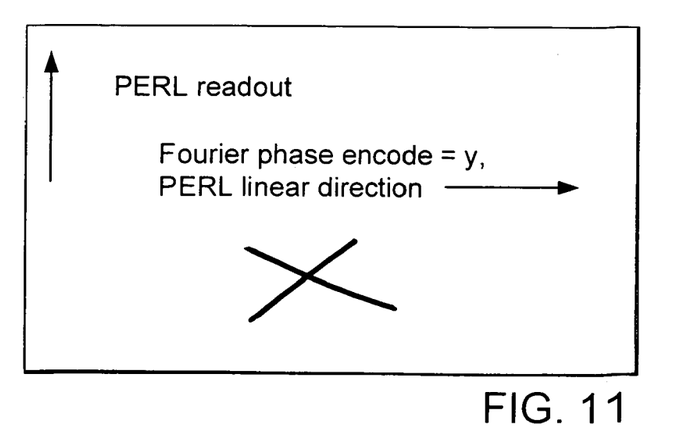

To select an appropriate current to pass through the PERL coil, another standard Fourier encoded image is acquired, but with the conventional phase encode gradient field varying along the linear (y) dimension of the PERL coil. Again, the PERL field is sustituted for the conventional read-out gradient. This results in an image as shown in FIG. 11, the slope of which depends on the ratio of the PERL field amplitude to the phase encode gradient amplitude. To determine the current through the PERL coil that produces the same bandwidth as that of the phase encode gradient, the current is then adjusted so that the angle of the slope is 45 degrees.

In use, the PERL coil assembly is placed on the patient bed. Because of the alternating current structure, there is no net force on the coils, hence no mechanical constraints are required to hold it in place.

In one practice of the invention, a 5-inch receive-only surface coil was placed on the bottom inside surface of the PERL coil assembly and a grapefruit was placed inside as a phantom. Imaging parameters were:
 TR=3000 ms,
 TE(m=0)=50 ms,
 ΔTE=96 μs,
 matrix size 96×96,
 slice thickness 2 mm, 16 spatial phase encodes,
number of samples per spatial phase encode=2400,
maximum number of $s_m(t-t_m)$ echoes acquired per excitation (i.e. spatial phase encode) $m_{max}$=192,
sampling dwell time=16 microseconds.
readout gradient $G_x$=0.489G/cm,
maximum PERL amplitude $G_p$=0.188G/cm
PERL encode time duration =2 ms.

The field-of-view was 300 mm in both the x and y dimensions, resulting in a resolution of 3.125 mm×3.125 mm. The total data acquisition time was the product of the number of spatial encodes and TR, which was 48 seconds.

Figure 12:
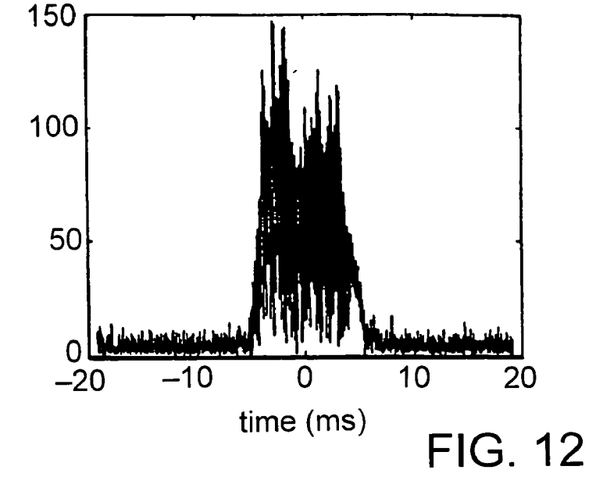
FIG. 12 is a graphical representation that shows an exemplary superposition of spin echoes detected by the MRI system.

In the exemplary data shown in FIG. 12, the signal is not refocused at only one time point but rather is spread over time. This indicates multiple spin echoes that spontaneously refocus at uniformly spaced values of TE. Thus PERL does not require a receiver with as large a dynamic range as traditional Fourier methods.

Figure 13:
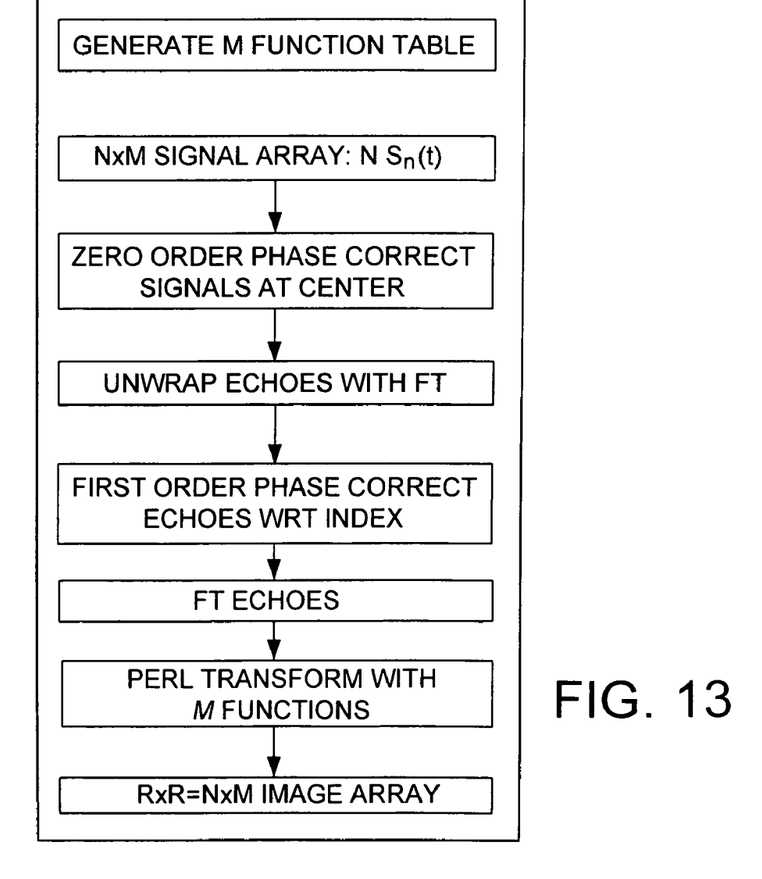
FIG. 13 is a flow-chart of an exemplary image reconstruction method.

FIG. 13 shows an overall flow diagram for reconstructing a PERL image in a two-dimensional R×R region.

The first step in the reconstruction method is to generate an R×$m_{max}$M-function table, where $m_{max}$ is the maximum index for $M_m(k_y,y)$. This step occurs only once for a given $k_y$ value. The M function table is quickly calculated using its Fourier form (equation [22]) and FFT (equation [8]).

The N spatial phase encode signals $S^{(n)}(t)$ each have a number of sampled points $N_{sam}$=$Rm_{max}$/N, where N is the number of overlapping echoes. These signals must first be phase corrected for any anomalous $B_o$ field arising from rotational misalignment between the PERL coil and the static magnetic field. The anomalous phase is calculated at the center of each signal corresponding to the m=0 echo.

An FFT along the spatial phase encode direction (see equation [11]) increases the echo separation spacing to R points, thereby allowing extraction of $m_{max}$+1 echoes (R points each) from the initial N×$N_{sam}$ signal array.

As seen in equation [6], a first order phase correction with respect to m accounts for the spatial phase offset. An FFT of each echo performs the reconstruction along x. Finally, the image is reconstructed by matrix multiplication using the M-functions:

$$\rho(x, y) = \sum_m \rho_m(x) M_m(k_y y). \quad [35]$$

Image reconstruction using the analytical form for the M-functions can be performed very quickly, thereby allowing timely observation of any data acquired.

Additional advantages of the method disclosed herein arise from the acquisition of data in both the x and y directions in a limited field-of-view without aliasing from objects outside that field-of-view. This occurs both because data acquired with the readout gradient $G_x$ is bandwidth limited and because a signal weighted by a Bessel function becomes spatially localized. The methods and systems described herein thus enable imaging of limited field-of-views without aliasing. In addition, any motion-induced artifacts in field-of-view are spatially localized. They corrupt only a limited portion of the image rather than the image as a whole. As a result, the methods and systems described herein are well-suited for such applications as, but not limited to, coronary artery imaging and all types of image guided therapy.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

The invention has been described in connection with reconstructing an MRI image. However, it is to be understood that the invention can be applied towards solving problems in many diverse applications where solutions to the form given by equation [26] are required. These applications include, without limitation, applications in radar, geology, fluid dynamics, acoustics, and optics.

Having described the invention, and a preferred embodiment thereof, what we claim as new, and secured by letters patent is:

What is claimed is:

1. A method of reconstructing an image, the method comprising:
   receiving a superposition of phase-weighted spin echoes, the superposition being representative of a two-dimensional spin density that encodes the image;
   recovering a partial spin density from the superposition of spin echoes, the partial spin density being a PERL transform of the two-dimensional spin density; and
   recovering the two-dimensional spin density from the partial spin density by analytically evaluating an inverse PERL transform of the partial spin density.

2. The method of claim 1, wherein recovering the two-dimensional spin density comprises evaluating an integral of the partial spin density weighted by a bandwidth-limited eigenfunction orthogonal to the Bessel functions.

3. The method of claim 2, further comprising selecting the bandwidth-limited eigenfunction to include an integral of a Chebycheff polynomial.

4. The method of claim 2, further comprising selecting the bandwidth-limited eigenfunction to include a term represented by $$M_m(ky) \equiv \frac{(-i)^m}{k\pi} \int_{-k}^{k} \cos\left(m \cos^{-1}\left(\frac{-\omega}{k}\right)\right) e^{-i\,\omega y} d\omega$$

where $\omega$ is a spatial angular frequency and k is a wave number.

* * * * *

UNITED STATES PATENT AND TRADEMARK OFFICE
CERTIFICATE OF CORRECTION

| | | |
|---|---|---|
| PATENT NO. | : 6,977,500 B1 | Page 1 of 1 |
| APPLICATION NO. | : 10/806985 | |
| DATED | : December 20, 2005 | |
| INVENTOR(S) | : Mirko I. Hrovat | |

It is certified that error appears in the above-identified patent and that said Letters Patent is hereby corrected as shown below:

Column 1
Line 9, insert the following: --This invention was made with Government support under Grant No. CA087734 awarded by the National Institutes of Health. The Government has certain rights to this invention.--

Signed and Sealed this

Twenty-first Day of July, 2009

JOHN DOLL
*Acting Director of the United States Patent and Trademark Office*